United States Patent
Norouzpourshirazi et al.

(10) Patent No.: US 12,132,494 B2
(45) Date of Patent: Oct. 29, 2024

(54) COMPENSATION OF ENVIRONMENTAL DRIFT BY TRACKING SWITCHED CAPACITOR IMPEDANCE VERSUS RESISTOR IMPEDANCE

(71) Applicant: Cirrus Logic International Semiconductor Ltd., Edinburgh (GB)

(72) Inventors: Arashk Norouzpourshirazi, Austin, TX (US); John L. Melanson, Austin, TX (US); Axel Thomsen, Austin, TX (US)

(73) Assignee: Cirrus Logic Inc., Austin, TX (US)

(*) Notice: Subject to any disclaimer, the term of this patent is extended or adjusted under 35 U.S.C. 154(b) by 217 days.

(21) Appl. No.: 17/939,166

(22) Filed: Sep. 7, 2022

(65) Prior Publication Data

US 2024/0080034 A1    Mar. 7, 2024

(51) Int. Cl.
| | |
|---|---|
| *H03M 1/06* | (2006.01) |
| *H03L 7/099* | (2006.01) |
| *H03M 1/10* | (2006.01) |
| *H03H 11/04* | (2006.01) |

(52) U.S. Cl.
CPC ........ *H03M 1/0629* (2013.01); *H03L 7/0991* (2013.01); *H03M 1/1009* (2013.01); *H03H 11/04* (2013.01)

(58) Field of Classification Search
CPC . H03M 1/0629; H03M 1/1009; H03L 7/0991; H03H 11/04
See application file for complete search history.

(56) References Cited

U.S. PATENT DOCUMENTS

2009/0219129 A1    9/2009 Denier et al.

FOREIGN PATENT DOCUMENTS

EP              477694 A2 *  4/1992  ............. H03H 11/04

OTHER PUBLICATIONS

Combined Search and Examination Report under Sections 17 and 18(3), UKIPO, Application No. GB2309450.1, mailed Dec. 20, 2023.

* cited by examiner

*Primary Examiner* — Joseph J Lauture
(74) *Attorney, Agent, or Firm* — Jackson Walker L.L.P.

(57) ABSTRACT

A method may include, for a signal path comprising a passive antialiasing filter sampled by a switched-capacitor front-end, monitoring a change of a first impedance of a resistor of the passive antialiasing filter responsive to an environmental condition relative to a second impedance of a switched capacitor of the switched-capacitor front end and compensating the signal path for a change in gain of the signal path resulting from the change of the first impedance.

32 Claims, 6 Drawing Sheets

COMPENSATION OF ENVIRONMENTAL DRIFT BY TRACKING SWITCHED CAPACITOR IMPEDANCE VERSUS RESISTOR IMPEDANCE

FIELD OF DISCLOSURE

The present disclosure relates in general to methods and systems for calibrating for temperature and other drift that may occur in an antialiasing filter.

BACKGROUND

Delta-sigma modulators are typically used in electronic circuits such as analog-to-digital converters (ADCs). Often, such ADCs employ an antialiasing filter to filter an analog input signal that may be sampled by a sampling network at the input of the delta-sigma modulator for conversion into an equivalent digital signal by the ADC. An example of such a sampling network is a switched capacitor circuit.

A resistive antialiasing filter may be directly loaded by a switched capacitor sampling front-end, with equivalent resistance of the switched capacitors loading a resistor (or resistors) of the antialiasing filter. Further, the larger the filter resistor, the more it may be loaded by the switched capacitors. In addition, the smaller the equivalent resistance of the switched capacitors (i.e., equivalent resistance decreases as sampling frequency and/or capacitance increases), the more the switched capacitors load the filter.

Due to temperature changes and/or other environmental factors, gain of the filter and switched capacitor circuit may vary. Thus, it is desirable to track and correct for such changes.

SUMMARY

In accordance with the teachings of the present disclosure, the disadvantages and problems associated with gain drift due to temperature or other environmental factors/variations in an antialiasing filter may be reduced or eliminated.

In accordance with embodiments of the present disclosure, a method may include, for a signal path comprising a passive antialiasing filter sampled by a switched-capacitor front-end, monitoring a change of a first impedance of a resistor of the passive antialiasing filter responsive to an environmental condition relative to a second impedance of a switched capacitor of the switched-capacitor front end and compensating the signal path for a change in gain of the signal path resulting from the change of the first impedance.

In accordance with these and other embodiments of the present disclosure, a system may include monitoring circuitry configured to monitor a change of a first impedance of a resistor of a passive antialiasing filter of a signal path responsive to an environmental condition relative to a second impedance of a switched capacitor of the switched-capacitor front end, wherein the passive antialiasing filter is sampled by a switched-capacitor front end and compensation circuitry configured to compensate the signal path for a change in gain of the signal path resulting from the change of the first impedance.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiment discussed below, and all such equivalents should be deemed as being encompassed by the present disclosure.

Figure 1:
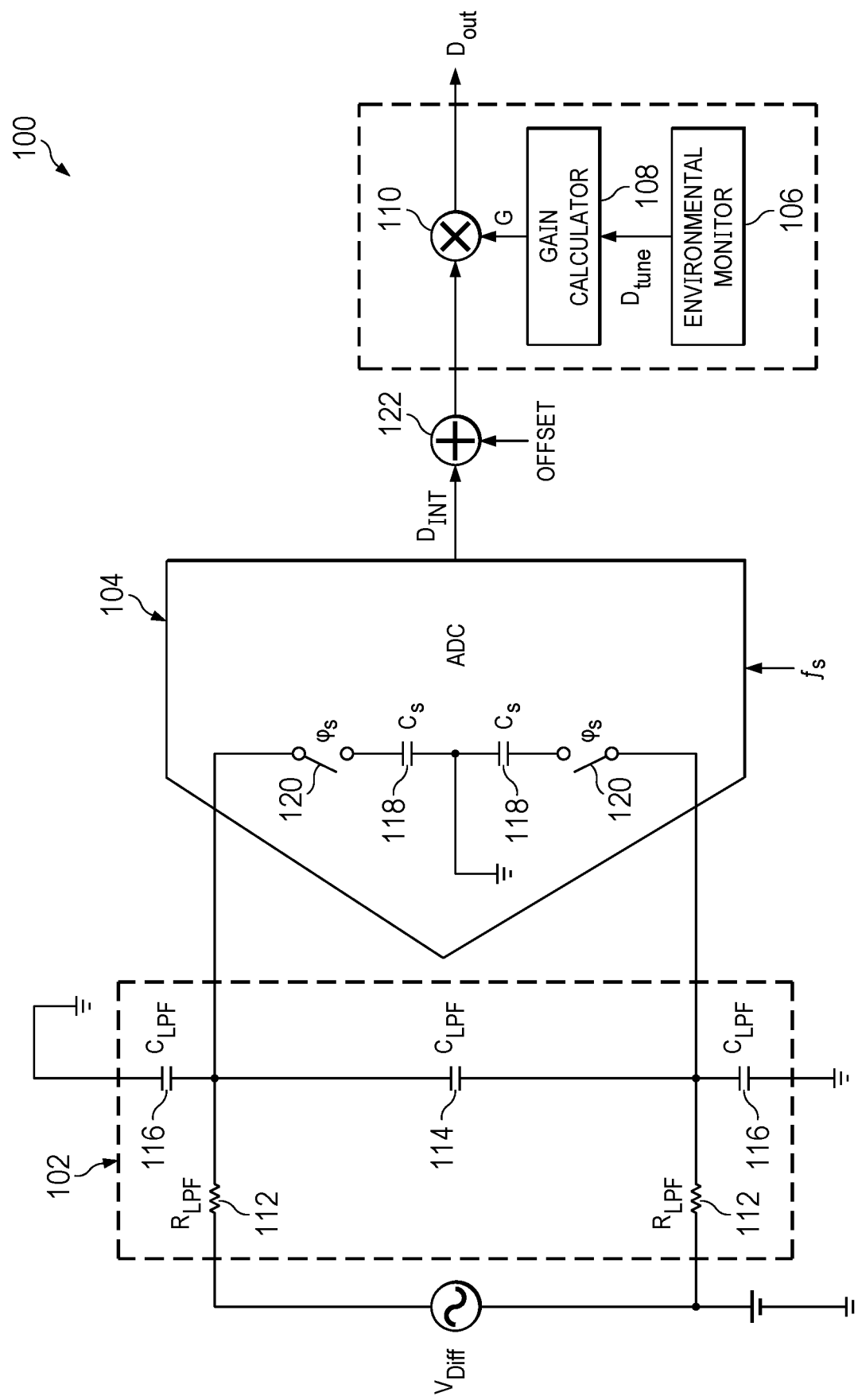
FIG. 1 illustrates an example system including a differential input ADC having an antialiasing filter at its input, with calibration circuitry for compensating for gain error resulting from environmental variations, in accordance with embodiments of the present disclosure.

FIG. 1 illustrates an example system 100 including a differential input ADC 104 having an antialiasing filter 102 at its input, with calibration circuitry for compensating for gain error resulting from environmental variations, in accordance with embodiments of the present disclosure. Such calibration circuitry may include an environmental monitor 106, a gain calculator 108, and a gain element 110.

Antialiasing filter 102 may comprise any suitable system, device, or apparatus, for receiving an analog input signal, for example in the form of a differential voltage $V_{Diff}$, and low-pass filtering the analog input signal to generate a filtered analog input signal to be received by the input of ADC 104. As shown in FIG. 1, antialiasing filter 102 may comprise resistors 112, each resistor 112 coupled between a respective input and a respective output of antialiasing filter 102. In addition, antialiasing filter 102 may include a capacitor 114 coupled between the outputs of antialiasing filter 102. Further, antialiasing filter 102 may include capacitors 116, each capacitor 116 coupled between a respective output of antialiasing filter 102 and ground.

ADC 104 may comprise any suitable system, device, or apparatus configured to sample the filtered analog signal generated at a sampling frequency $f_s$ and generate a digital signal $D_{INT}$ equivalent to such filtered analog signal. As shown in FIG. 1, ADC 104 may include an input sampling network comprising switched capacitors 118 and sampling switches 120 that may operate in accordance with a sampling clock $\varphi_S$ operating at sampling frequency $f_s$. An input sampling network may be more complex than that depicted in FIG. 1 and may include other components besides switched capacitors 118 and sampling switches 120. Only switched capacitors 118 and sampling switches 120 are shown for purposes of clarity and exposition.

A combiner 122 may combine digital signal $D_{INT}$ with an offset value OFFSET that may offset for mismatches between resistors 112, capacitors 116, and/or any other sources of offset in the differential path of system 100. The calculation of offset value OFFSET may be made in any suitable manner, and is beyond the scope of the present disclosure.

Environmental monitor 106 may comprise any system, device, or apparatus configured to detect a change in temperature and/or other environmental condition in system 100 that may cause a change in a resistance $R_{LPF}$ of resistors 112, which in turn may cause a change in signal gain within system 100, and generate a digital tuning signal $D_{tune}$ as a function of such change in resistance $R_{LPF}$. In general, environmental monitor 106 may measure a resistor impedance that changes in a manner similar to that of resistance $R_{LPF}$ in response to environmental changes, and compare such impedance to an impedance similar to equivalent resistance of switched capacitors 118 (which may be largely non-responsive and remain fixed in response to environmental changes) to track an effect of the environmental changes to resistance $R_{LPF}$ of resistors 112. Examples of an environmental monitor 106 are depicted in FIGS. 2 and 3, described below.

Gain calculator 108 may comprise any system, device, or apparatus configured to, based on digital tuning signal $D_{tune}$, calculate a digital gain G to be applied to digital signal $D_{INT}$ (or offset-corrected digital signal $D_{INT}$ output by combiner 122) in order to compensate for changes to resistance $R_{LPF}$ of resistors 112 responsive to environmental changes. Such gain G may be determined in any suitable manner, including offline characterization (e.g., during pre-delivery characterization of system 100), that may define a function relating digital tuning signal $D_{tune}$ to gain G (e.g., an algebraic formula, lookup table, mapping, etc.).

Gain element 110 may multiply gain G to offset-corrected digital signal $D_{INT}$ output by combiner 122 in order to generate a digital output signal $D_{OUT}$ equivalent to differential voltage $V_{Diff}$. Such digital output signal $D_{OUT}$ may be further processed by other digital circuitry as may be suitable to the application for which system 100 is used.

Figure 2:
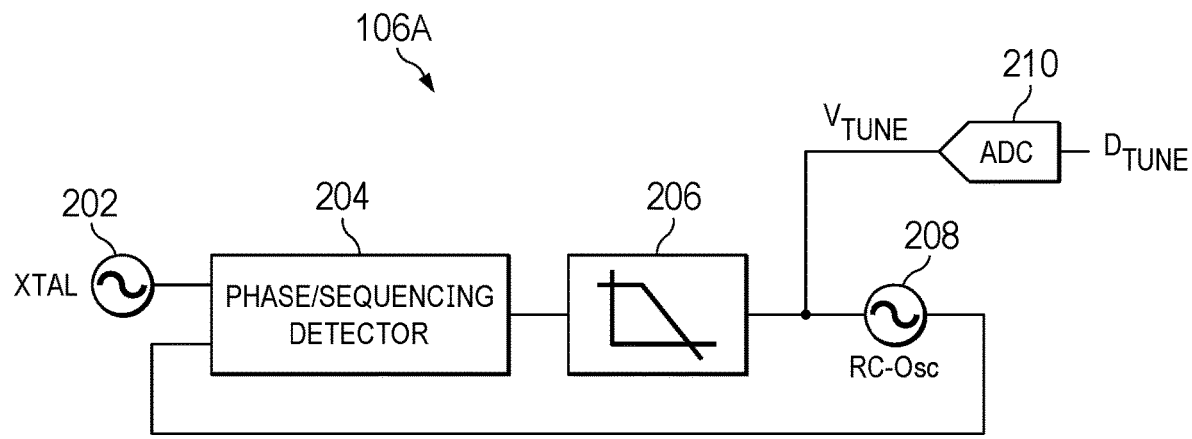
FIG. 2 illustrates an example environmental monitor implemented using a phase and/or frequency locked loop with a tunable resistive-capacitive oscillator, in accordance with embodiments of the present disclosure.
Figure 3:
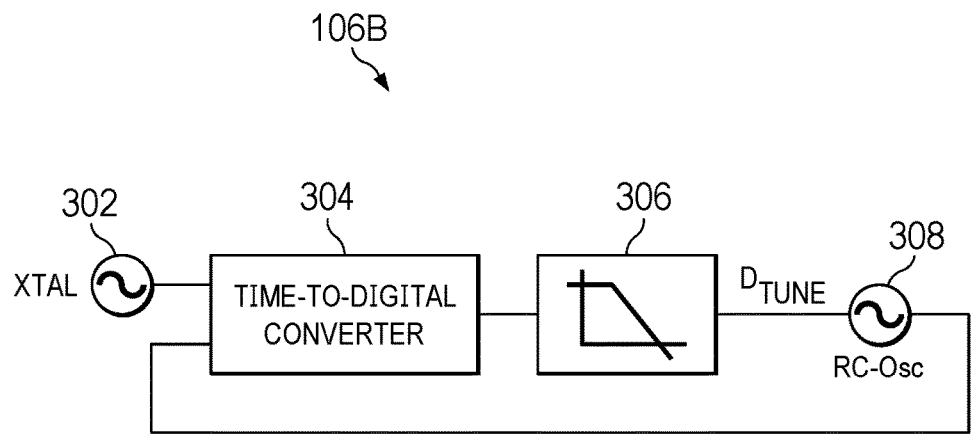
FIG. 3 illustrates an example environmental monitor implemented using a time-to-digital converter with a tunable digitally-controlled resistive-capacitive oscillator, in accordance with embodiments of the present disclosure.

FIG. 2 illustrates an example environmental monitor 106A implemented using a phase-locked loop (PLL) and/or frequency-locked loop (FLL) with a tunable resistive-capacitive oscillator 208, in accordance with embodiments of the present disclosure. In some embodiments, environmental monitor 106A may be used to implement environmental monitor 106. As shown in FIG. 2, environmental monitor 106A may include a crystal oscillator 202, a phase and/or frequency detector 204, a low-pass filter 206, resistive-capacitive oscillator 208, and an ADC 210.

Crystal oscillator 202 (or another stable low-drift clock source) may comprise any suitable system, device, or apparatus configured to drive a periodic (e.g., sine wave) clock signal.

Phase and/or frequency detector 204 may comprise any suitable system, device, or apparatus configured to generate an error signal based on the difference between the periodic clock signal generated by crystal oscillator 202 and a feedback oscillation signal generated by resistive-capacitive oscillator 208. Such difference may be a phase difference between the periodic clock signal generated by crystal oscillator 202 and the feedback oscillation signal generated by resistive-capacitive oscillator 208 and/or a frequency difference between the periodic clock signal generated by crystal oscillator 202 and the feedback oscillation signal generated by resistive-capacitive oscillator 208. Low-pass filter 206 may filter such error signal in the analog domain, thus generating a voltage tuning signal $V_{tune}$ to be applied to the input of resistive-capacitive oscillator 208 in order to minimize the error signal generated by phase and/or frequency detector 204.

Assuming the resistor(s) of resistive-capacitive oscillator 208 are of the same type of resistor as resistors 112, and also assuming that the capacitor(s) of resistive-capacitive oscillator 208 are substantially non-responsive to changes in temperature and/or other environmental variations, then the change in resistance of resistor(s) of resistive-capacitive oscillator 208 relative to the equivalent impedance of capacitor(s) of resistive-capacitive oscillator 208 may be a proxy for (e.g., substantially proportional to) the change of resistance $R_{LPF}$ relative to the equivalent impedance of switched capacitors 118. Because voltage tuning signal $V_{tune}$ may be a function of the change in resistance of resistor(s) of resistive-capacitive oscillator 208 relative to the equivalent impedance of capacitor(s) of resistive-capacitive oscillator 208, voltage tuning signal $V_{tune}$ may in effect measure the change of resistance $R_{LPF}$ relative to the equivalent impedance of switched capacitors 118.

Based on the resulting filtered error signal it receives, resistive-capacitive oscillator 208 may generate the feedback oscillation signal. Further, ADC 210 may convert voltage tuning signal $V_{tune}$ into an equivalent digital signal—digital tuning signal $D_{tune}$—thus enabling gain calculator 108 to calculate gain G based on the change of resistance $R_{LPF}$ relative to the equivalent impedance of switched capacitors 118.

FIG. 3 illustrates an example environmental monitor 106B implemented using a time-to-digital converter 304 with a tunable digitally-controlled resistive-capacitive oscillator 308, in accordance with embodiments of the present disclosure. In some embodiments, environmental monitor 106B may be used to implement environmental monitor 106. As shown in FIG. 3, environmental monitor 106B may include a crystal oscillator 302, a time-to-digital converter 304, a low-pass filter 306, and resistive-capacitive oscillator 308. In many practical respects, environmental monitor 106B has similar functionality to that of environmental monitor 106A.

Crystal oscillator 302 (or another stable low-drift clock source) may comprise any suitable system, device, or apparatus configured to drive a periodic (e.g., sine wave) clock signal.

Time-to-digital converter 304 may comprise any suitable system, device, or apparatus configured to generate a digital error signal based on a phase and/or frequency difference between the periodic clock signal generated by crystal oscillator 302 and a feedback oscillation signal generated by digitally-controlled resistive-capacitive oscillator 308. Low-pass filter 306 may filter such digital error signal in the digital domain, thus generating digital tuning signal $D_{tune}$ to be applied to the input of resistive-capacitive oscillator 308 in order to minimize the error signal generated by time-to-digital converter 304.

Assuming the resistor(s) digitally modeled in digitally-controlled resistive-capacitive oscillator 308 are of the same type of resistor as resistors 112, and also assuming that the capacitor(s) digitally modeled in digitally-controlled resistive-capacitive oscillator 308 are substantially non-responsive to changes in temperature and/or other environmental variations, then the change in resistance of resistor(s) of resistive-capacitive oscillator 308 relative to the equivalent impedance of capacitor(s) of resistive-capacitive oscillator 308 may be a proxy for (e.g., substantially proportional to) the change of resistance $R_{LPF}$ relative to the equivalent impedance of switched capacitors 118. Because digital tuning signal $D_{tune}$ may be a function of the change in resistance of resistor(s) of resistive-capacitive oscillator 208 relative to the equivalent impedance of capacitor(s) of resistive-capacitive oscillator 208, digital tuning signal $D_{tune}$ may in effect measure the change of resistance $R_{LPF}$ relative to the equivalent impedance of switched capacitors 118.

Figure 4:
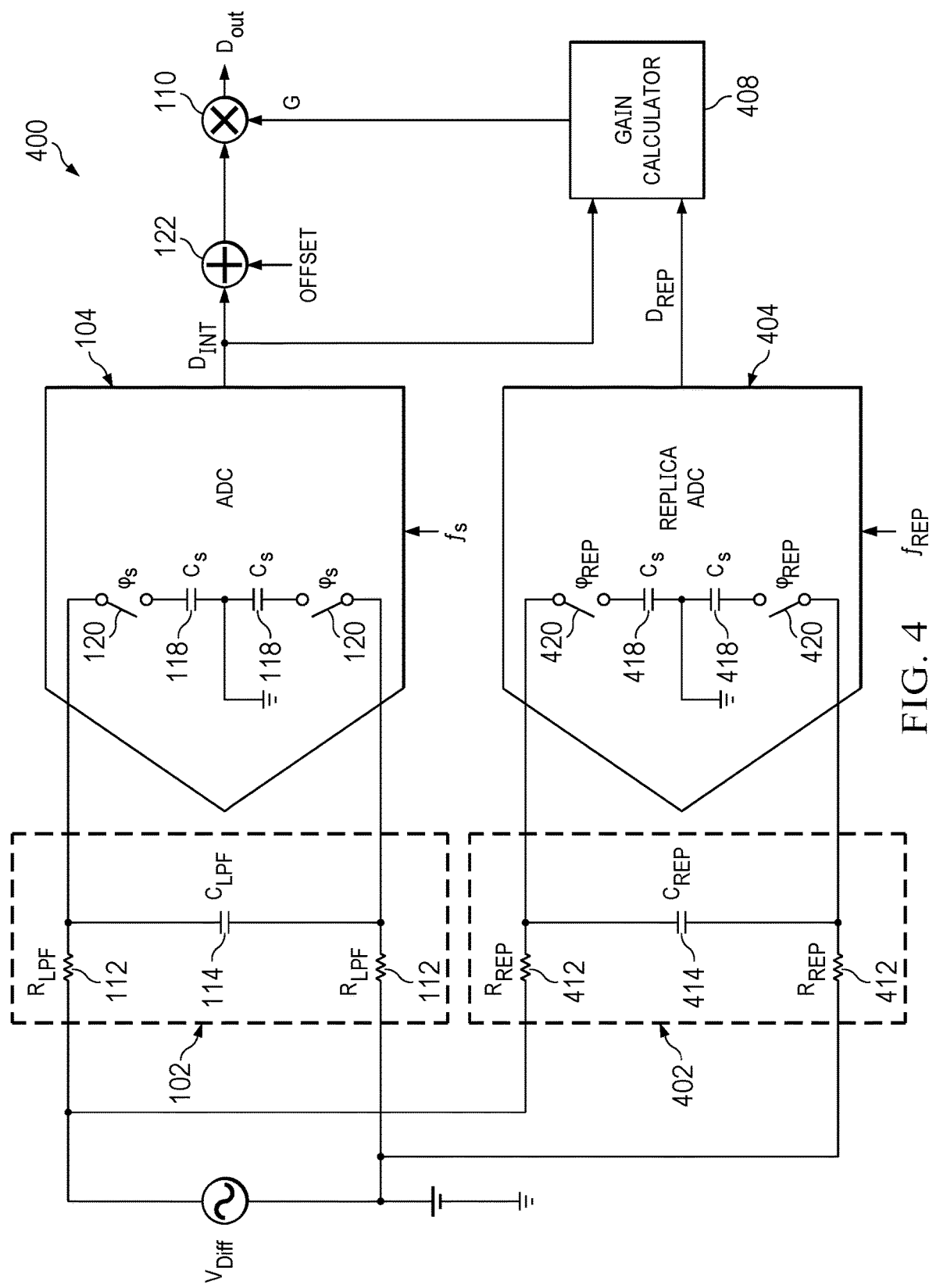
FIG. 4 illustrates an example system including a differential input ADC having an antialiasing filter at its input, and a replica antialiasing filter and replica ADC operating in parallel with the antialiasing filter and the differential input ADC, in accordance with embodiments of the present disclosure.

Alternatively to the approaches described above, a replica of antialiasing filter 102 and ADC 104 may be used to measure changes in resistance $R_{LPF}$ in response to environmental variations. For example, FIG. 4 illustrates an example system 400 including a differential input ADC 104 having an antialiasing filter 102 at its input, and a replica antialiasing filter 402 and replica ADC 404 operating in parallel with antialiasing filter 102 and differential input ADC 104, in accordance with embodiments of the present disclosure.

Antialiasing filter 102 and components thereof, ADC 104 and components thereof, combiner 122, and gain element 110 of system 400 may be similar (or identical) in many respects to antialiasing filter 102 and components thereof, ADC 104 and components thereof, combiner 122, and gain element 110 of system 100.

Replica antialiasing filter 402 may comprise any suitable system, device, or apparatus, for receiving an analog input signal, for example in the form of a differential voltage $V_{Diff}$, and low-pass filtering the analog input signal to generate a filtered replica analog input signal to be received by the input of replica ADC 404. As shown in FIG. 4, replica antialiasing filter 402 may comprise resistors 412, each resistor 412 coupled between a respective input and a respective output of replica antialiasing filter 402 and having a resistance $R_{REP}$ which may be substantially equal to or substantially different from resistance $R_{LPF}$ of resistors 112. In addition, antialiasing filter 402 may include a capacitor 414 coupled between the outputs of replica antialiasing filter 402 and having a capacitance $C_{REP}$ which may be substantially equal to or substantially different from capacitance $C_{LPF}$ of capacitor 114.

Replica ADC 404 may comprise any suitable system, device, or apparatus configured to sample the filtered analog signal generated at a sampling frequency $f_{REP}$, which may be substantially equal to or substantially different from sampling frequency $f_S$, and generate a replica digital signal $D_{REP}$ equivalent to such filtered analog signal. As shown in FIG. 4, replica ADC 404 may include a replica input sampling network comprising replica switched capacitors 418 and replica sampling switches 420 that may operate in accordance with a replica sampling clock $\varphi_{REP}$ operating at replica sampling frequency $f_{REP}$.

In operation, replica antialiasing filter 402 and replica ADC 404 may be configured to generate replica digital signal $D_{REP}$, which may track the gain error due to environmental variations with higher sensitivity than digital signal $D_{INT}$. Gain calculator 408 may then apply any suitable mathematical combination to calculate gain G to be applied to off-set corrected digital signal $D_{INT}$. For example, in some embodiments, gain G may be calculated as $G=D_{INT}/D_{REP}$.

Figure 5:
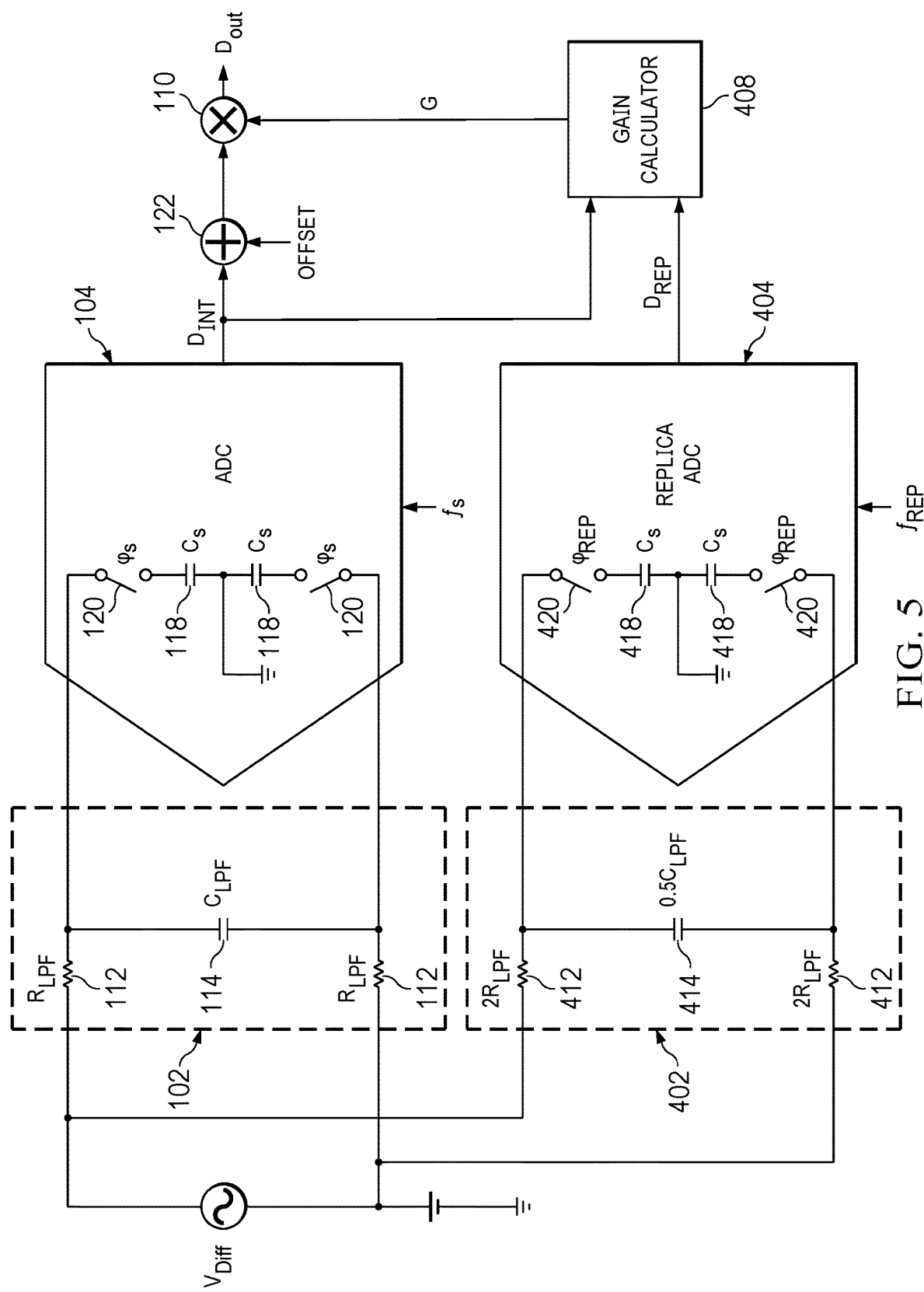
FIG. 5 illustrates an example system of FIG. 4 with the replica antialiasing filter having different resistances and capacitances than those of the antialiasing filter, in accordance with embodiments of the present disclosure.

In some embodiments, $R_{REP}>R_{LPF}$ and/or $C_{REP}<C_{LPF}$, with $f_{REP}=f_S$. For example, as shown in FIG. 5, $R_{REP}=2R_{LPF}$ and $C_{REP}=0.5C_{LPF}$. Further, in some embodiments, $R_{REP}=R_{LPF}$ and $C_{REP}<C_{LPF}$. In addition, in yet other embodiments, $R_{REP}>R_{LPF}$ and $C_{REP}=C_{LPF}$. In any case, in the embodiments represented by FIGS. 4 and 5, a gain difference and/or ratio between digital signal $D_{INT}$ and replica digital signal $D_{REP}$ may be used to track variation of resistors 112 responsive to environmental variations and correct for such variation. In some instances, such approach may be used to provide runtime in-situ calibration responsive to environmental variations.

Figure 6:
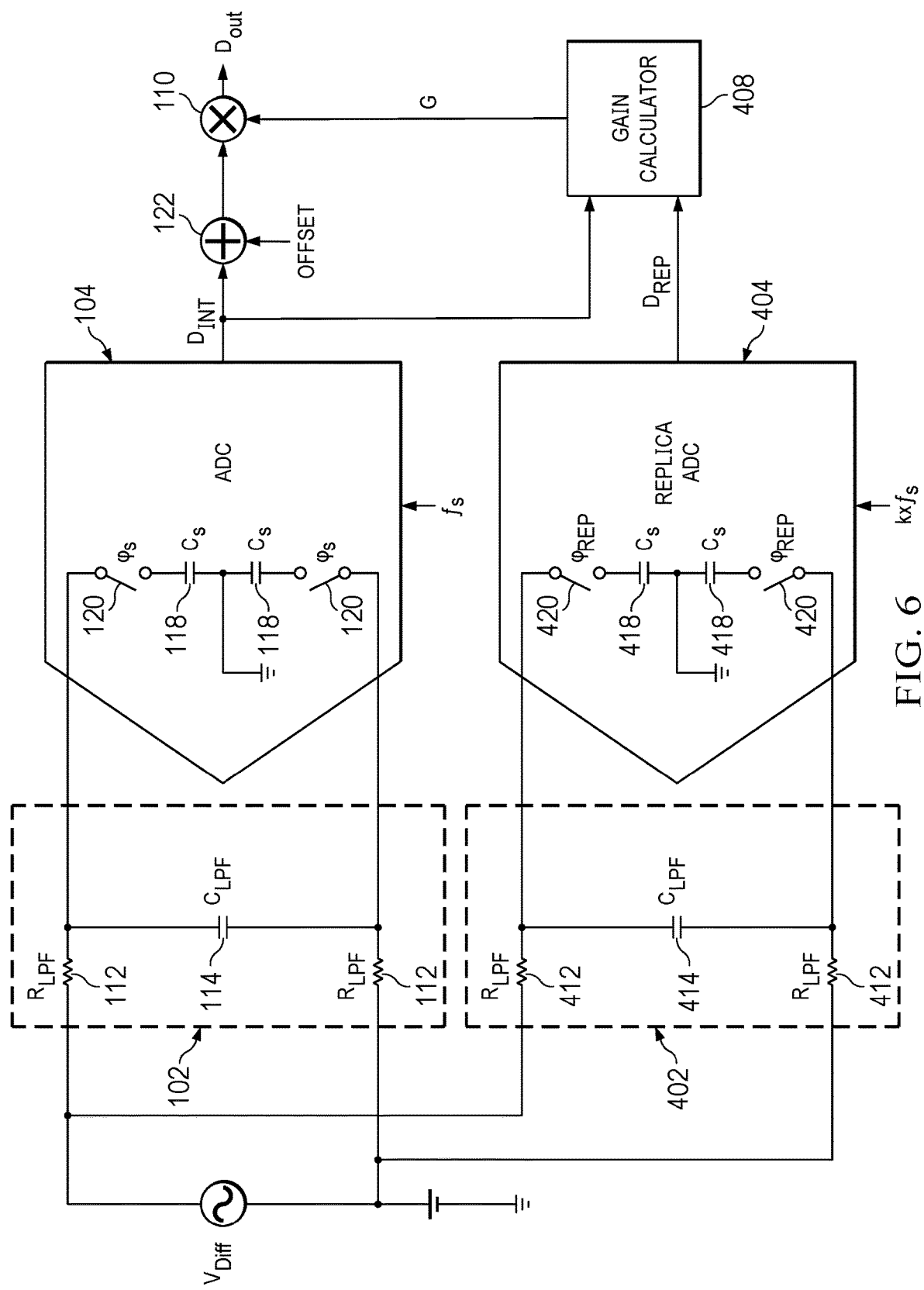
FIG. 6 illustrates an example system of FIG. 4 with the replica ADC having a sampling frequency different than that of the ADC, in accordance with embodiments of the present disclosure.

In some embodiments, $f_{REP} \neq f_S$ while $R_{REP}=R_{LPF}$ and $C_{REP}=C_{LPF}$, as depicted in FIG. 6. In other words, replica antialiasing filter 402 may have impedances substantially identical to that of antialiasing filter 102, with replica ADC 404 having a known replica sampling frequency $f_{REP}$ different than that of sampling frequency $f_S$ (e.g., $f_{REP}=k \cdot f_S$). Again, as in the arrangement shown in FIG. 5, a gain difference and/or ratio between digital signal $D_{INT}$ and replica digital signal $D_{REP}$ (generated at such other sampling frequency) may be used to track variation of resistors 112 responsive to environmental variations and correct for such variation. In some instances, such approach may be used to provide runtime in-situ calibration responsive to environmental variations.

One alternative approach to that shown in FIG. 6 is to configure system 400 such that $f_{REP}=f_S$, $R_{REP}=R_{LPF}$, and $C_{REP}=C_{LPF}$, but with replica sampling capacitors 418 having a different (e.g., significantly higher) capacitance than that of sampling capacitors 118. Again, as in the arrangement shown in FIGS. 5 and 6, a gain difference and/or ratio between digital signal $D_{INT}$ and replica digital signal $D_{REP}$ may be used to track variation of resistors 112 responsive to environmental variations and correct for such variation. In some instances, such approach may be used to provide runtime in-situ calibration responsive to environmental variations.

Alternatively to the approach of the previous paragraph, replica antialiasing filter 402 and replica ADC 404 may be absent, and ADC 102 may be run at two different sampling rates and calibration for environmental variations may be determined based on the difference or ratio between the measurements of digital signal $D_{INT}$ at the two different sampling rates.

Figure 7:
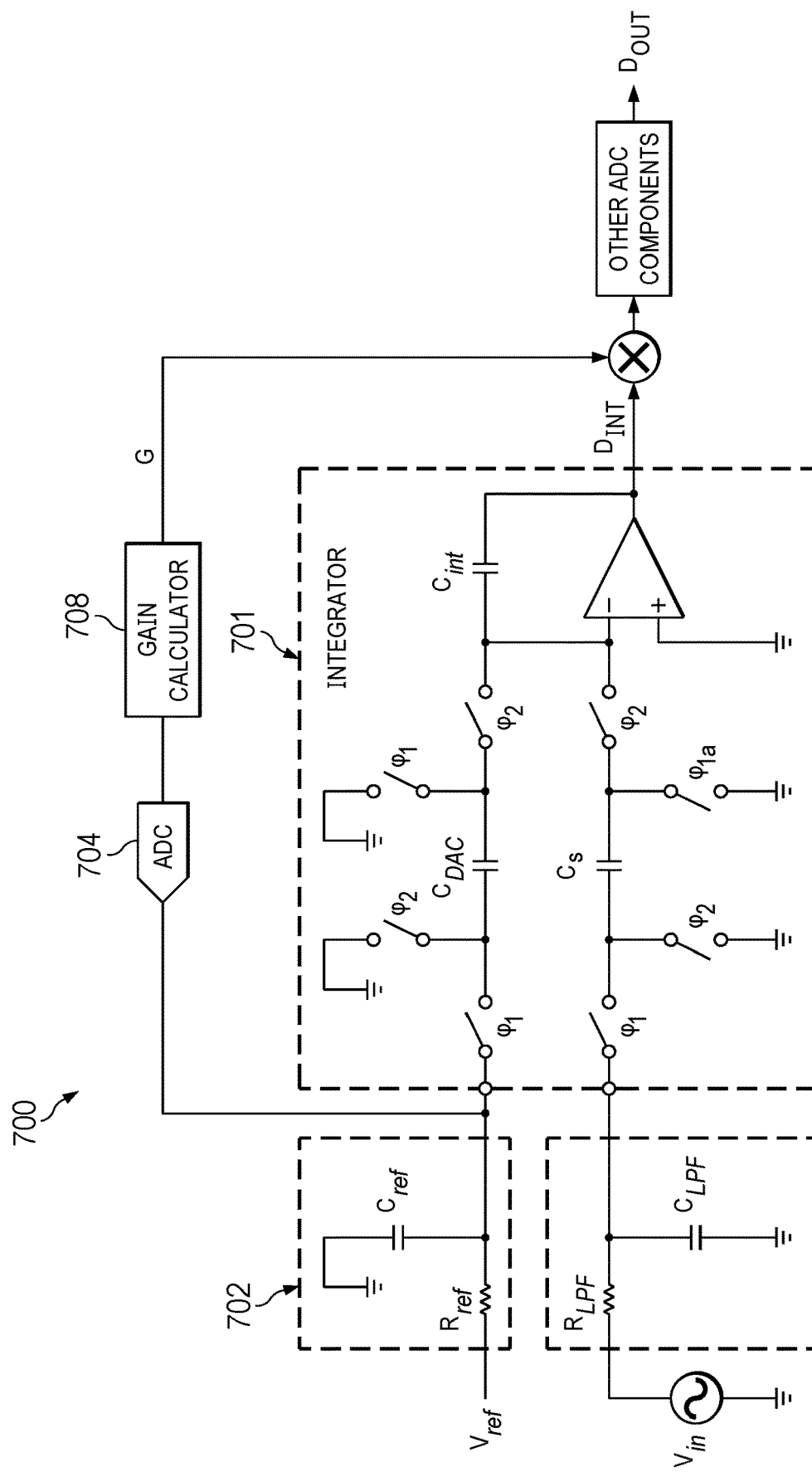
FIG. 7 illustrates an example system including an input integrator having an antialiasing filter at its input, with gain correction performed using reference filtering, in accordance with embodiments of the present disclosure.

FIG. 7 illustrates an example system 700 including an input integrator 701 (which may be an input integrator of an ADC) having an antialiasing filter 102 at its input, with gain correction performed by filtering of a reference voltage $V_{ref}$ to integrator 701, in accordance with embodiments of the present disclosure. As shown in FIG. 7, reference voltage $V_{ref}$ may be filtered by a resistive-capacitive filter 702 loaded by a switched-capacitor reference path of integrator 701, such that a front-end drop in gain due to environmental variations that affect resistance $R_{LPF}$ may be inherently corrected by an increase of the gain of ADC 704 comprising integrator 701 due to the drop in reference voltage $V_{ref}$. Thus, with proper sizing of capacitor ratios $R_{ref}:C_{ref}$ and $R_{LPF}:C_{LPF}$, an inherent calibration of temperature coefficient may be achieved, without a need for any additional bench or in-situ calibration (e.g., using the approaches of FIGS. 1-6). In other words, in a data converter (e.g., an ADC) wherein a reference voltage is filtered by a resistive-capacitive filter loaded by the switched-capacitor reference path of the data converter, a front-end gain drop may be calculated by gain calculator 708 and compensated for, by monitoring the drop in the reference voltage as a result of switched-capacitor loading on the reference path resistive-capacitive filter.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A method comprising, for a signal path comprising a passive antialiasing filter sampled by a switched-capacitor front-end:
    monitoring a change of a first impedance of a resistor of the passive antialiasing filter responsive to an environmental condition relative to a second impedance of a switched capacitor of the switched-capacitor front end; and
    compensating the signal path for a change in gain of the signal path resulting from the change of the first impedance.

2. The method of claim 1, wherein:
    monitoring the change of the first impedance comprises operating an analog phase-locked loop comprising an analog-controlled resistive-capacitive oscillator, such that a control input to the analog-controlled resistive-capacitive oscillator is indicative of the change of the first impedance; and
    compensating the signal path for the change in gain comprises applying a gain to the signal path that is a function of the control input.

3. The method of claim 1, wherein:
    monitoring the change of the first impedance comprises operating an analog frequency-locked loop comprising an analog-controlled resistive-capacitive oscillator, such that a control input to the analog-controlled resistive-capacitive oscillator is indicative of the change of the first impedance; and
    compensating the signal path for the change in gain comprises applying a gain to the signal path that is a function of the control input.

4. The method of claim 1, wherein:
    monitoring the change of the first impedance comprises operating a digital phase-locked loop comprising a time-to-digital converter and a digitally-controlled resistive-capacitive oscillator, such that a control input to the digitally-controlled resistive-capacitive oscillator is indicative of the change of the first impedance; and
    compensating the signal path for the change in gain comprises applying a gain to the signal path that is a function of the control input.

5. The method of claim 1, wherein:
    monitoring the change in the first impedance comprises:
        measuring an output of the signal path; and
        measuring a replica output of a replica signal path of the signal path and parallel to the signal path, wherein the replica signal path comprises a replica passive antialiasing filter sampled by a replica switched-capacitor front-end; and
    compensating the signal path for the change in gain comprises applying a gain to the signal path that is a function of the output and the replica output.

6. The method of claim 5, wherein the replica antialiasing filter includes a replica resistor analogous to the resistor and a replica switched capacitor analogous to the switched capacitor.

7. The method of claim 6, wherein the first impedance is substantially different from a third impedance of the replica resistor.

8. The method of claim 7, wherein the second impedance is substantially different from a fourth impedance of the replica switched capacitor.

9. The method of claim 8, wherein the replica switched-capacitor front-end is driven by a replica sampling clock at approximately a same frequency of a sampling clock for driving the switched-capacitor front end.

10. The method of claim 7, wherein the replica switched-capacitor front-end is driven by a replica sampling clock at approximately a same frequency of a sampling clock for driving the switched-capacitor front end.

11. The method of claim 6, wherein the replica switched-capacitor front-end is driven by a replica sampling clock at approximately a same frequency of a sampling clock for driving the switched-capacitor front end.

12. The method of claim 6, wherein the replica switched-capacitor front-end is driven by a replica sampling clock at a substantially different frequency than a sampling clock for driving the switched-capacitor front end.

13. The method of claim 12, wherein:
the first impedance is substantially different from a third impedance of the replica resistor; and
the second impedance is substantially different from a fourth impedance of the replica switched capacitor.

14. The method of claim 1, wherein:
monitoring the change in the first impedance comprises:
measuring a first output of the signal path responsive to operation of the switched-capacitor front end at a first frequency; and
measuring a second output of the signal path responsive to operation of the switched-capacitor front end at a second frequency substantially different than the first frequency; and
compensating the signal path for the change in gain comprises applying a gain to the signal path that is a function of the first output and the second output.

15. The method of claim 1, wherein:
monitoring the change in the first impedance comprises:
filtering a reference voltage to a data converter comprising the switched-capacitor front end with a resistive-capacitive reference filter which is loaded by a switched-capacitor reference path; and
measuring a front-end gain drop of the reference voltage; and
compensating the signal path for the change in gain comprises automatically correcting a back-end gain and/or the front-end gain drop of the reference voltage by an increase in gain of the data converter as a result of the front-end gain drop of the reference voltage.

16. The method of claim 1, wherein the environmental condition is a temperature.

17. A system comprising:
monitoring circuitry configured to monitor a change of a first impedance of a resistor of a passive antialiasing filter of a signal path responsive to an environmental condition relative to a second impedance of a switched capacitor of a switched-capacitor front end, wherein the passive antialiasing filter is sampled by the switched-capacitor front end; and
compensation circuitry configured to compensate the signal path for a change in gain of the signal path resulting from the change of the first impedance.

18. The system of claim 17, wherein:
monitoring the change of the first impedance comprises operating an analog phase-locked loop comprising an analog-controlled resistive-capacitive oscillator, such that a control input to the analog-controlled resistive-capacitive oscillator is indicative of the change of the first impedance; and
compensating the signal path for the change in gain comprises applying a gain to the signal path that is a function of the control input.

19. The system of claim 17, wherein:
monitoring the change of the first impedance comprises operating an analog frequency-locked loop comprising an analog-controlled resistive-capacitive oscillator, such that a control input to the analog-controlled resistive-capacitive oscillator is indicative of the change of the first impedance; and
compensating the signal path for the change in gain comprises applying a gain to the signal path that is a function of the control input.

20. The system of claim 17, wherein:
monitoring the change of the first impedance comprises operating a digital phase-locked loop comprising a time-to-digital converter and a digitally-controlled resistive-capacitive oscillator, such that a control input to the digitally-controlled resistive-capacitive oscillator is indicative of the change of the first impedance; and
compensating the signal path for the change in gain comprises applying a gain to the signal path that is a function of the control input.

21. The system of claim 17, wherein:
monitoring the change in the first impedance comprises:
measuring an output of the signal path; and
measuring a replica output of a replica signal path of the signal path and parallel to the signal path, wherein the replica signal path comprises a replica passive antialiasing filter sampled by a replica switched-capacitor front-end; and
compensating the signal path for the change in gain comprises applying a gain to the signal path that is a function of the output and the replica output.

22. The system of claim 21, wherein the replica antialiasing filter includes a replica resistor analogous to the resistor and a replica switched capacitor analogous to the switched capacitor.

23. The system of claim 22, wherein the first impedance is substantially different from a third impedance of the replica resistor.

24. The system of claim 23, wherein the second impedance is substantially different from a fourth impedance of the replica switched capacitor.

25. The system of claim 24, wherein the replica switched-capacitor front-end is driven by a replica sampling clock at approximately a same frequency of a sampling clock for driving the switched-capacitor front end.

26. The system of claim 23, wherein the replica switched-capacitor front-end is driven by a replica sampling clock at approximately a same frequency of a sampling clock for driving the switched-capacitor front end.

27. The system of claim 22, wherein the replica switched-capacitor front-end is driven by a replica sampling clock at approximately a same frequency of a sampling clock for driving the switched-capacitor front end.

28. The system of claim 22, wherein the replica switched-capacitor front-end is driven by a replica sampling clock at a substantially different frequency than a sampling clock for driving the switched-capacitor front end.

29. The system of claim 28, wherein:
the first impedance is substantially different from a third impedance of the replica resistor; and
the second impedance is substantially different from a fourth impedance of the replica switched capacitor.

30. The system of claim 17, wherein:
monitoring the change in the first impedance comprises:
measuring a first output of the signal path responsive to operation of the switched-capacitor front end at a first frequency; and
measuring a second output of the signal path responsive to operation of the switched-capacitor front end at a second frequency substantially different than the first frequency; and
compensating the signal path for the change in gain comprises applying a gain to the signal path that is a function of the first output and the second output.

31. The system of claim 17, wherein:
monitoring the change in the first impedance comprises:
filtering a reference voltage to a data converter comprising the switched-capacitor front end with a resistive-capacitive reference filter which is loaded by a switched-capacitor reference path; and
measuring a front-end gain drop of the reference voltage; and
compensating the signal path for the change in gain comprises automatically correcting a back-end gain and/or the front-end gain drop of the reference voltage by an increase in gain of the data converter as a result of the front-end gain drop of the reference voltage.

32. The system of claim 17, wherein the environmental condition is a temperature.

* * * * *